(12) United States Patent
Lee et al.

(10) Patent No.: US 7,364,925 B2
(45) Date of Patent: Apr. 29, 2008

(54) ORGANIC LIGHT EMITTING DEVICE HAVING A PROTECTIVE BARRIER

(75) Inventors: Chung J. Lee, Fremont, CA (US); Chieh Chen, Palo Alto, CA (US); Atul Kumar, Santa Clara, CA (US)

(73) Assignee: International Display Systems, Inc., Freemont, CA (US)

( * ) Notice: Subject to any disclaimer, the term of this patent is extended or adjusted under 35 U.S.C. 154(b) by 499 days.

(21) Appl. No.: 11/009,285

(22) Filed: Dec. 8, 2004

(65) Prior Publication Data

US 2005/0146267 A1    Jul. 7, 2005

Related U.S. Application Data

(63) Continuation-in-part of application No. 10/116,724, filed on Apr. 4, 2002, now Pat. No. 6,881,447.

(51) Int. Cl.
*H01L 21/00* (2006.01)
(52) U.S. Cl. .............. 438/21; 438/26; 438/28; 438/125; 438/126; 257/E21.035
(58) Field of Classification Search ................. None
See application file for complete search history.

(56) References Cited

U.S. PATENT DOCUMENTS

| | | | |
|---|---|---|---|
| 5,538,758 A | 7/1996 | Beach et al. | |
| 5,686,360 A | 11/1997 | Harvey, III et al. | |
| 5,693,956 A * | 12/1997 | Shi et al. ................ | 257/40 |
| 5,757,126 A * | 5/1998 | Harvey et al. ........... | 313/506 |
| 5,771,562 A | 6/1998 | Harvey, III et al. | |
| 6,140,456 A | 10/2000 | Lee et al. | |
| 6,198,220 B1 | 3/2001 | Jones et al. | |
| 6,226,890 B1 | 5/2001 | Boroson et al. | |
| 6,268,695 B1 | 7/2001 | Affinito | |

(Continued)

FOREIGN PATENT DOCUMENTS

WO    WO 99/21924    5/1999

(Continued)

OTHER PUBLICATIONS

Soo, et al., "Study to Minimise Oled Device Drgradation and Failure Using a Parylene Layer", Institute of Materials Research and Engineering, Singapore, www.imre.a-star.edu.sg. 1 Pg.

(Continued)

*Primary Examiner*—Michael Lebentritt
*Assistant Examiner*—Kyoung Lee
(74) *Attorney, Agent, or Firm*—Alleman Hall McCoy Rusell & Tuttle LLP

(57) ABSTRACT

A method of forming a protective barrier in an organic light emitting device is disclosed, wherein the organic light emitting device is formed on a substrate and includes a plurality of layers of materials, the plurality of layers of materials including an organic light emitting layer. The method includes forming an inorganic layer and a semi-crystalline parylene-based polymer layer over an underlying layer, wherein the semi-crystalline parylene-based polymer layer is formed via transport polymerization of a reactive intermediate species. Organic light emitting devices having barriers are also disclosed.

36 Claims, 2 Drawing Sheets

U.S. PATENT DOCUMENTS

| | | |
|---|---|---|
| 6,495,208 B1 | 12/2002 | Desu et al. |
| 6,497,598 B2 | 12/2002 | Affinito |
| 6,522,067 B1 | 2/2003 | Graff et al. |
| 6,548,912 B1 | 4/2003 | Graff et al. |
| 6,570,325 B2 | 5/2003 | Graff et al. |
| 6,573,652 B1 | 6/2003 | Graff et al. |
| 6,608,283 B2 | 8/2003 | Liu et al. |
| 6,703,462 B2 | 3/2004 | Lee |
| 6,740,145 B2 | 5/2004 | Boroson et al. |
| 6,797,343 B2 | 9/2004 | Lee |
| 6,866,901 B2 | 3/2005 | Burrows et al. |
| 6,923,702 B2 | 8/2005 | Graff et al. |
| 2003/0038590 A1* | 2/2003 | Silvermail et al. ........... 313/504 |
| 2003/0195312 A1 | 10/2003 | Lee et al. |
| 2003/0196680 A1 | 10/2003 | Lee et al. |
| 2003/0198579 A1 | 10/2003 | Lee et al. |

FOREIGN PATENT DOCUMENTS

| | | |
|---|---|---|
| WO | WO 99/22043 | 5/1999 |

OTHER PUBLICATIONS http://www.batop.de/information/r_bragg.html, Datop GmbH-Optoelectronics-Bragg relector, BATOP GmbH Semiconductor Optoelectronic devices, (5 Pgs.).

Iwamoto, et al., Dept. of Chemistry, Rensselaer Polytechnic Institute, Troy, New York, "Crystallization During Polymerization of Poly-p-Xylylene. III. Crystal Structure and Molecular Orientation as a Function of Temperature", Journal of Polymer Science, vol. 13, pp. 1925-1938.

Chung J. Lee, Dept. of Chemistry, Rensselaer Polytechnic Institute, Troy, New York, "Transport Polymerizatiopn of Gaseous Intermediates and Polymer Crystals Growth". Copyright 1977-1978, pp. 79-127.

C-L Lang, et al., Rensselaer Polytechnic Institute, center for Integrated Electronics, Troy, New York, Vapor Deposition of Very Low K Polymer Films, Poly(Naphthalene), Poly(Fluorinated Naphthalene), XP-002065704, Mat. Res. Soc. Symp. Proc. vol. 381, Copyright 1995 Materials Research Society , pp. 45-50.

E. Todd Ryan, et al., Center for Materials Science and Engineering, University of Texas, Austin Texas, "Effect of Deposition and Annealing on the Thermomechanical Properties of Parylene Films" XP-001120235, Mat. Res. Soc. Symp. Proc. vol. 476, Copyright 1997, Materials Research Society, pp. 225-230.

Andreas Greiner, "POLY (l,4-xylylene)s: Polymer Films By Chemical Vapour Deposition", Copyright 1997, Elsevier Science Ltd., TRIP vol. 5, No. 1., pp. 12-16.

M.A. Plano, et al., "The Effect of Deposition Conditions on the Properties of Vapor-Deposited Parylene AF-4 Films", XP-001120236, Mat. Res. Soc. Symp. Proc. vol. 476, Copyright 1997, Materials Research Society, pp. 213-218.

J.F. Wilson, Jr., et al., "Study of Hydrogen Annealing of Ultrahigh Molecular Weight Polyethylene Irradiated With High-Energy Protons". Journal Materials Research, vol. 14, No. 11, Copyright 1999, Materials Research Society, pp. 4431-4436.

D. Mathur, et al., "Vapor Deposition of Parylene-F Using Hydrogen as Carrier Gas", Journal Materials Research, vol. 14, No. 1, Copyright 1999, Materials Research Society, pp. 246-250.

Michael Morgen, et al., "Morphological Transition In Fluorinated and Non-Fluorinated Parylenes", XP-001120143, Journal Materials Research, vol. 565, Copyright 1999. Materials Research Society, pp. 297-302.

Jay Lewis, et al., "Thin Film Permeation Barrier Technology for Flexible Organic Light-Emitting Devices", Journal of Selected topics in Quantum Electronics, 2003, pp. 1-13.

Solid State Technology, "A Vacuum Roll-To-Roll Process For Manufacturing Oled's", Copyright 2005, PennWell Corporation, pp. 1-4.

Solid State Technology, "Integrating A Nonporous Low-K (K=2.2) Film", Copyright 2005, PennWell Corporation, pp. 1-5.

Solid State Technology, "Plain Talk on Low-K Dielectrics", Copyright 2005, PennWell Corporation, pp. 1-4.

* cited by examiner

ORGANIC LIGHT EMITTING DEVICE HAVING A PROTECTIVE BARRIER

CROSS-REFERENCES TO PRIORITY APPLICATION

This application is a continuation-in-part of U.S. patent application Ser. No. 10/116,724, filed Apr. 4, 2002, now U.S. Pat. No. 6,881,447, which is incorporated herein by reference in its entirety for all purposes.

TECHNICAL FIELD

The present disclosure relates to an organic light emitting device, and more particularly to an organic light emitting device having a barrier for protection against environmental degradation.

BACKGROUND

Organic light emitting devices ("OLEDs") have shown great promise as thinner, lighter-weight displays for the displacement of current liquid crystal displays ("LCDs"). This is due at least to the lower power consumption, wider view angle, better brightness, video-speed capability and simpler and lower cost manufacturing processes of OLEDs relative to LCDs. An OLED is a device that utilizes an organic species (either a small molecule or a polymer) to emit light under an applied electric field. Many different OLED architectures are known, but all typically share some common features. For example, OLEDs typically include an anode formed from a transparent electrically conductive material (for example, indium tin oxide ("ITO")), a cathode formed from a low work function metal (for example, lithium, magnesium, indium, calcium, or barium), and two or more organic layers disposed between the cathode and the anode. Application of an electric field across the cathode and anode causes electrons and holes respectively to be injected into the organic layers and move through the device. The holes and electrons may combine in the organic layers to form excited molecular species ("exitons"), which may then emit light via decay to the ground state. Emitted light can exit the OLED through the transparent anode.

In so-called frontside-emitting OLEDs, the ITO layer is deposited on a transparent substrate, such as glass, and the organic layers are deposited onto the ITO layer. Emitted light exits the device through the substrate. In so-called backside-emitting OLEDs, the ITO layer is deposited after the organic light emitting layer. Emitted light exits the device through the face opposite the substrate.

As mentioned above, OLEDs potentially offer many advantages over other display technologies. For example, OLEDS are inexpensive and relatively simple to manufacture, do not have a brightness that is dependent upon viewing angle, and can potentially be formed on flexible substrates. However, the low work function metals typically used as cathodes in OLEDs are environmentally sensitive, and may be easily oxidized by moisture or oxygen from air. Therefore, it is important to protect these materials from air both during processing and during use.

Commercially-produced OLEDs typically utilize a glass or metal canister that is bonded over the device layers of the OLED with an adhesive to protect the device from atmospheric water vapor and oxygen. A desiccant may be included within the canister interior for additional protection. Such structures are quite bulky, and therefore are suitable only for smaller applications, such as for personal digital assistants ("PDAs") and cellular phones. Furthermore, the rigidity glass or metal canister also may make these encapsulation methods unsuitable for flexible OLEDs.

Another approach for encapsulating OLEDs has been to deposit alternating films of polymer and inorganic materials over the OLED device layers. For example, U.S. Pat. No. 6,570,325 to Graff et al. discloses depositing alternating layers of a polymer, such as polyacrylate or parylene, and an inorganic material, such as aluminum oxide, silicon dioxide, silicon nitride, etc. over the device layers. In this structure, the inorganic layer acts as a moisture/oxygen barrier, while the organic material serves to "decouple" adjacent inorganic layers, thereby preventing defects in the inorganic layers (which are the primary route of oxygen/water vapor transport through the inorganic layers) from propagating between layers. Such a barrier stack utilizing polyacrylate as a polymer layer has been found to have a water vapor transport rate ("WVTR") of approximately $10^{-5}$-$10^{-6}$ g/m$^2$/day/atm. This is adequate for devices having expected lifetimes of two years or less, but not suitable for devices with expected lifetimes of more than two years, such as computer monitors and televisions, which require a WVTR on the order of $10^{-10}$-$10^{-12}$ g/m$^2$/day/atm.

Polyacrylate has become the most common commercially used polymer for such barrier stacks. This is because the polyacrylate can be formed by thermally evaporating polyacrylate monomer onto a substrate under vacuum, followed by irradiating the acrylate monomer with UV radiation to form the polymer. However, several critical issues have prohibited this process from becoming a production-worthy process for protection of OLED devices. For instance, in the barrier stack of Graff, the polymer layers have relatively high WVTR and oxygen transport rate ("OTR") values, and therefore offer little assistance to the inorganic layers in blocking oxygen and water vapor. The films deposited as described in Graff are amorphous, and tend to have disordered, porous structures, leading to the high WVTR and OTR values. Furthermore, the monomer used to form polyacrylate tends to deposit on all surfaces of a deposition chamber, rather than just the substrate. Therefore, the deposition chamber used to deposit the polyacrylate may require frequent cleaning. Also, the acrylate monomer is a liquid, and can penetrate the organic light emitting molecules of the OLED during encapsulation via pinholes in the cathode. This may render the organic light emitter less effective. Additionally, the polyacrylate layer has limited thermal stability. Therefore, deposition of an inorganic barrier layer over a polyacrylate layer requires the use of lower temperature processes such as sputtering, which typically have lower throughputs than the deposition of such films by chemical vapor deposition. Furthermore, polyacrylate has a much higher coefficient of thermal expansion (>30-50 ppm/° C.) than commonly used inorganic films (2-6 ppm/° C.). This large difference in the CTE of the inorganic and polyacrylate layers may result in high thermal stress at the interfaces between layers. Since multiple alternating polyacrylate and inorganic layers are needed for achieving a suitably low WVTR, the resulting high thermal stresses at the inorganic-polyacrylate interfaces may cause delamination of the layers, making the reliability of such OLED displays an issue for long-term applications.

SUMMARY

One embodiment provides a method of forming a protective barrier in an organic light emitting device, wherein the organic light emitting device is formed on a substrate and includes a plurality of layers of materials, the plurality of layers of materials including an organic light emitting layer. The method includes forming an inorganic layer and a parylene-based polymer layer over an underlying layer, wherein the parylene-based polymer layer is formed via transport polymerization of a reactive intermediate species, and wherein the substrate has a temperature below the melting temperature of the reactive intermediate species during transport polymerization.

Another embodiment provides a method of forming a protective barrier in an organic light emitting device, the organic light emitting device including a plurality of layers of materials formed on a substrate, the plurality of layers of materials including an organic light-emitting layer. The method includes forming an inorganic layer and a semi-crystalline parylene-based polymer layer over an underlying layer, and annealing the semi-crystalline parylene-based polymer layer to form a more-highly crystalline parylene-based polymer layer.

Yet another embodiment provides, in an organic light emitting device package including a plurality of layers of materials formed on a substrate, the plurality of layers of materials including an organic light emitting layer, a protective barrier for protecting the organic light emitting device from environmental degradation, the protective barrier including a first semi-crystalline parylene-based layer, and an inorganic barrier layer.

DETAILED DESCRIPTION OF THE DEPICTED EMBODIMENTS

One embodiment provides a method of forming a protective barrier in an organic light emitting device ("OLED"). The method includes forming an at least semi-crystalline parylene-based polymer barrier layer and an inorganic barrier layer over the organic light emitting device layers. The method may also include forming another at least semi-crystalline parylene-based polymer layer over the inorganic layer, thereby forming a parylene-based polymer/inorganic/parylene-based polymer composite barrier film. Other layers, such as reflective layers to assist in annealing processes, may furthermore be included in the barrier. Each of these embodiments is described in more detail below.

In yet other embodiments, one or more semi-crystalline parylene-based polymer barrier layers and/or inorganic barrier layers are formed over organic light emitting device layers, and then a barrier structure, including but not limited to, a hermetically-sealing canister or cap, is bonded over the device layers to seal the device layers via a glue, a metal flux, or other suitable adhesive. The barrier structure may be bonded over the device layers under atmospheric conditions due to the protection offered by the semi-crystalline parylene-based polymer layers and/or the inorganic barrier layers. A desiccant may be provided within the barrier structure to provide further protection against contaminants.

The semi-crystalline parylene-based polymer films of the embodiments described herein are deposited under such conditions that the films has a relatively high initial crystallinity, for example, equal to or above 10%. A semi-crystalline, and especially a highly crystalline parylene-based polymer film has a greatly improved density and decreased free volume (which is defined as open volume in the amorphous area excluding pinholes and defects) compared to amorphous parylene films and other organic polymer films, such as polyacrylate films. The highly crystalline parylene-based polymer layers have low-enough WVTR and OTR values that they not only "decouple" adjacent inorganic layers to prevent the propagation of defects between inorganic layers, but also themselves help block water vapor and oxygen permeation into the OLED. In this sense, the semi-crystalline and highly crystalline parylene-based polymer films actually act as barrier layers. Therefore, an OLED having barrier constructed with the semi-crystalline and highly crystalline parylene-based polymer barrier layers as described herein may have a significantly improved lifetime compared to prior OLEDs having polyacrylate or amorphous parylene barrier layers. Each of these embodiments is described in more detail below.

Figure 1:
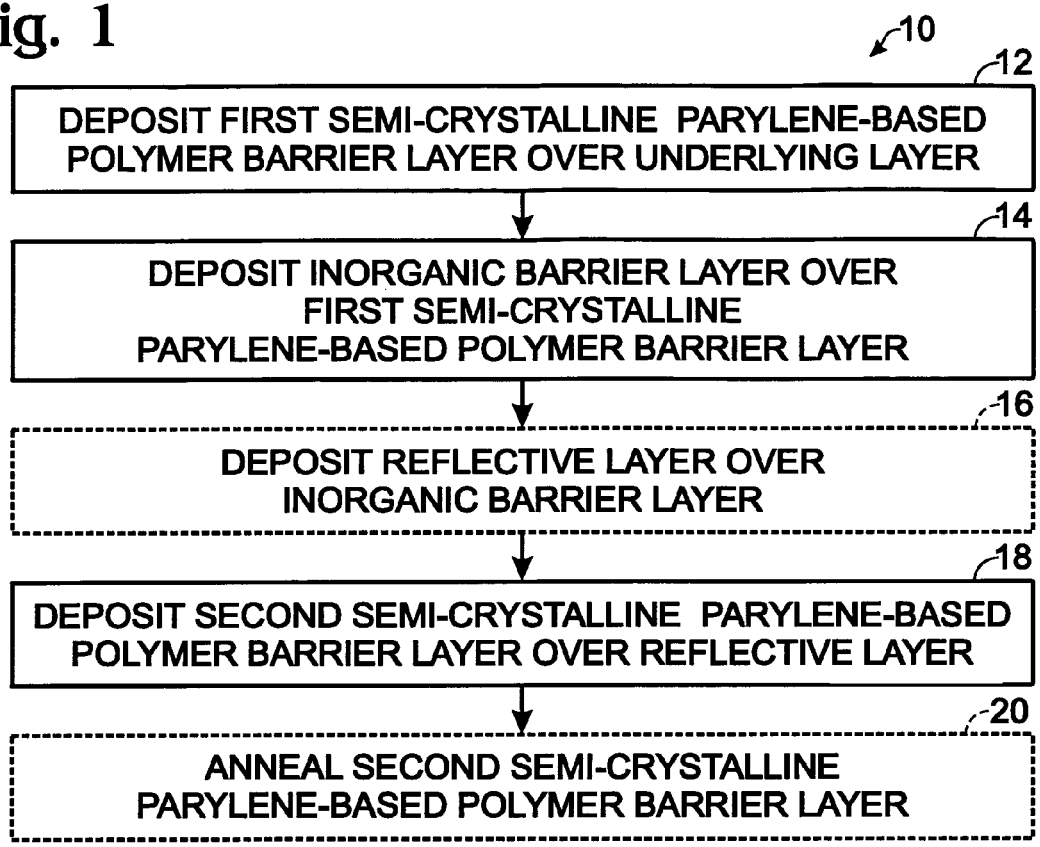
FIG. 1 is a flow diagram illustrating an embodiment of a method for forming a protective barrier in an organic light emitting device.
Figure 2:
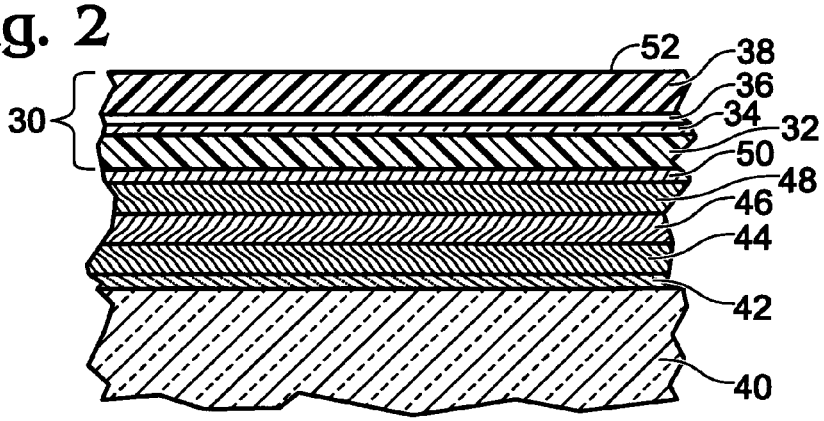
FIG. 2 is a greatly magnified, sectional view of an embodiment of an organic light emitting device having a protective barrier.

FIG. 1 illustrates, generally at 10, one exemplary embodiment of a method for forming a barrier layer in an OLED, and FIG. 2 shows, generally at 30, a greatly magnified, sectional view of an OLED having barrier formed via the method of FIG. 1. Method 10 includes forming (at 12) a first semi-crystalline parylene-based polymer layer over an underlying layer, forming (at 14) an inorganic barrier layer over the first semi-crystalline parylene-based polymer layer, optionally forming (at 16) a reflective layer over the inorganic barrier layer, forming (at 18) a second semi-crystalline parylene-based polymer layer over the reflective layer, and annealing (at 20) the second semi-crystalline parylene-based polymer layer to from a highly crystalline parylene-based polymer layer.

The first semi-crystalline parylene-based polymer layer is shown in FIG. 2 at 32, the inorganic barrier layer is shown at 34, an optional anti-reflective layer is shown at 36, and the second semi-crystalline parylene-based polymer layer is shown at 38. The OLED device layers are formed on a substrate 40, and include a transparent anode 42, an organic hole transport layer 44, an organic light emitting layer 46, an organic electron transport layer 48, and a cathode 50 formed from a low work function metal. It will be appreciated that the depicted OLED architecture is merely exemplary, and that any other suitable architecture may be used. The specific materials used for the device layers are well known in the art, and are therefore not described in further detail herein.

As described above, the first semi-crystalline and second highly crystalline parylene-based polymer layers respectively have at least 10% and up to 70% of crystallinity. Generally, the term "parylene-based polymer films" includes, but is not limited to, polymers having a general repeat unit of ($-CZ^1Z^2-Ar-CZ^3Z^4-$), wherein Ar is an aromatic (unsubstituted, partially substituted or fully substituted), and wherein $Z^1$, $Z^2$, $Z^3$ and $Z^4$ are similar or different. In specific embodiments, Ar is $C_6H_{4-x}X_x$, wherein X is a halogen, and each of $Z^1$, $Z^2$, $Z^3$ and $Z^4$ individually are H, F or an alkyl or aromatic group. In one specific embodiment, a partially fluorinated parylene-based polymer known as "PPX-F" is used. This polymer has a repeat unit of (—$CF_2$—$C_6H_4$—$CF_2$—), and may be formed from various precursors, including but not limited to $BrCF_2$—$C_6H_4$—$CF_2Br$. In another specific embodiment, fully fluorinated poly(paraxylylene) is used. This polymer has a repeat unit of (—$CF_2$—$C_6F_4$—$CF_2$—). In yet another specific embodiment, unfluorinated poly(paraxylylene) ("PPX-N") is used. This polymer has a repeat unit of (—$CH_2$—$C_6H_4$—$CH_2$—). It will be appreciated that these specific embodiments of parylene-based polymer films are set forth for the purposes of example, and are not intended to be limiting in any sense.

The above-described semi-crystalline parylene-based polymer films may be formed via the CVD technique of transport polymerization as disclosed in U.S. Pat. No. 6,797,343, the disclosure of which is hereby incorporated by reference. Transport polymerization involves generating a gas-phase reactive intermediate from a precursor molecule at a location remote from a substrate surface and then transporting the gas-phase reactive intermediate to the substrate surface, wherein the substrate surface is kept below the melting temperature of the reactive intermediates for polymerization. For example, PPX-F may be formed from the precursor $BrCF_2$—$C_6H_4$—$CF_2Br$ by the removal of the bromine atoms into the reactive intermediate *$CF_2$—$C_6H_4$—$CF_2$* (wherein * denotes a free radical) at a location remote from the deposition chamber, as described in U.S. patent application Ser. No. 10/854,776, filed May 25, 2004, the disclosure of which is hereby incorporated by reference. This reactive intermediate may then be transported into the deposition chamber and condensed onto a substrate surface, where polymerization takes place. Careful control of deposition chamber pressure, reactive intermediate feed rate and substrate surface temperature can result in the formation of a parylene-based polymer film having a high level of initial crystallinity. The film may then be annealed to increase its crystallinity and, in some cases, to convert it to a more dimensionally and thermally stable phase, as described in more detail below. Methods for forming semi- and highly crystalline parylene-based polymer films are also described in U.S. Pat. No. 6,703,462, issued on Mar. 9, 2004, the disclosure of which is hereby incorporated by reference.

It has been found that parylene-based polymer films of significant initial crystallinity (equal to or greater than approximately 10%) may be formed via transport polymerization by condensing the reactive intermediate onto a substrate surface cooled to a temperature at least below the melting point of the reactive intermediate. Where the substrate temperature is in an optimal range, reactive intermediate molecules adsorb to the substrate surface with sufficient energy to reorient themselves along crystal axes before polymerization, thereby forming generally aligned polymer chains.

The conditions under which such crystalline growth occur may depend upon other variables besides the substrate temperature, including but not limited to, the system pressure, reactive intermediate feed rate, and system leak rate (system leakage can introduce free-radical scavengers, such as oxygen, water, etc. from the outside atmosphere that can terminate growth of the chains of the parylene-based polymers). In the specific example of PPX-F, examples of suitable ranges for these variables include, but are not limited to, the following: deposition chamber pressures of approximately 1 to 100 mTorr (and, in specific embodiments, approximately 5 to 25 mTorr); substrate temperatures of approximately −10 to −80 degrees Celsius (and, in specific embodiments, between approximately −25 to −45 degrees Celsius); leakage rates of approximately 2 mTorr/min or less (and, in specific embodiments, as low as 0.4 mTorr/min or less); and reactive intermediate feed rates of approximately 1 to 20 sccm. It will be appreciated that these ranges are merely exemplary, and that processing conditions outside of these ranges may also be used to produce semi-crystalline parylene-based polymers.

The crystallinity of an as-deposited, semi-crystalline parylene-based polymer barrier film may be improved by annealing the film after deposition. The semi-crystalline films formed via the above-described deposition techniques result in the formation of generally-aligned polymer chains (as opposed to room-temperature depositions, which tend to result in highly randomly-oriented chain formation and an amorphous film). Therefore, annealing may provide sufficient energy to the semi-crystalline film to provide rotational energy to the polymer chains to improve the crystallinity of the barrier film. The use of an annealing process may improve the crystallinity of the semi-crystalline parylene-based polymer film from the initial 10% to as high as 70%, thereby greatly lowering the WVTR and OTR of the resulting film. While annealing may significantly improve the moisture- and oxygen-barrier properties of a semi-crystalline parylene-based polymer film, it will be appreciated that even an as-deposited and un-annealed semi-crystalline parylene-based polymer film formed via the methods described herein may have sufficient crystallinity to be useful as a barrier layer.

An annealing process may also be used to convert the semi-crystalline parylene-based polymer barrier films to more thermally stable phases. Many parylene-based polymers, including but not limited to PPX-F and PPX-N, may have several different solid phases that exist at different temperatures and/or pressures. For example, the phase diagram of PPX-F includes at least an alpha phase, a beta-1 phase and a beta-2 phase. The alpha phase is a solid phase that exists at lower temperatures. When forming a PPX-F film by transport polymerization onto a substrate, relatively large amounts of alpha phase material may be initially formed. PPX-F undergoes an irreversible phase transition between the alpha phase and beta-1 phase when heated to a temperature of approximately 200-290° C. Therefore, an annealing step may be used to convert an as-deposited PPX-F film to a more dimensionally stable beta-1 phase. Furthermore, PPX-F undergoes a reversible beta-1 to beta-2 phase transition at a temperature of 350-400° C. It has been found that PPX-F films can be trapped in the beta-2 phase by first heating to a temperature above the beta-1 to beta-2 phase transition temperature, holding the PPX-F film at 350 to 400° C. for a duration of, for example, 2 to 30 minutes, and then cooling the film at a fairly rapid rate, for example, between 30 and 50° C./sec, to a temperature below the beta-1 to beta-2 phase transition temperature. In this case, an annealing step followed by a rapid cooling step may be used to trap a film in a beta-2 phase so that, in the event that the film will have to undergo further processing steps at temperatures higher than the beta-1 to beta-2 phase transition temperature, no dimension-changing beta-1 to beta-2 phase transition will occur. It will be appreciated that the annealing and cooling conditions described above are merely exemplary, and that suitable annealing conditions outside of the stated ranges may also be used. Furthermore, it will be appreciated that the annealing concepts described above may be extended to other parylene-based polymer films that have similar or different solid phase boundaries.

Another advantage offered by the semi-crystalline and highly crystalline parylene-based polymer films over polyacrylate films for use in OLED barrier structures is that these films ate more thermally stable. For example, most amorphous polyacrylate has a glass transition temperature below 80 to 120° C., whereas PPX-F has a glass transition temperature of approximately 170° C. Therefore, higher temperature downstream processing steps may be used with the semi-crystalline parylene films of this invention versus polyacrylate. Furthermore, because the parylene films described herein are at least partially crystalline, only the amorphous portion of the parylene-based polymer film undergoes a phase transition at the glass transition temperature, thereby reducing the dimensional change due to this phase transition and its effects on the OLED devices. Additionally, annealing the semi-crystalline parylene-based polymer film to increase the crystallinity of the film has the additional advantage that the quantity of amorphous film that transitions to a glass phase upon cooling past the glass transition temperature is greatly reduced by annealing.

The semi-crystalline and highly crystalline parylene-based polymer layers may have any suitable thickness. Suitable thicknesses for these layers include, but are not limited to, thicknesses between approximately 1000 and 30,000 Angstroms.

Inorganic barrier layer 34 is formed after forming first semi-crystalline parylene-based polymer layer 32 and before forming second semi-crystalline parylene-based polymer layer 38. The thermal stability of the semi-crystalline parylene-based polymers used in first parylene-based polymer layer 32 and second parylene-based polymer layer 38 allows the use of chemical vapor deposition techniques to form inorganic barrier layer 34 as an option. This is in contrast to polyacrylate, which requires the use of lower temperature techniques such as sputtering to be used to form inorganic barrier layers. Chemical vapor deposition techniques typically generate better barrier films and allow higher throughput than sputtering techniques.

Any suitable materials may be used to form inorganic barrier layer 34. Examples of suitable materials include, but are not limited to, aluminum, alumina, $SiO_2$, $SiO_xN_y$, and $Si_xN_y$. Likewise, inorganic barrier layer 34 may have any suitable thickness. Suitable thicknesses include, but are not limited to, thicknesses between 500 and 5000 Angstroms.

Some of the organic materials used as electron transport layers, hole transport layers, and/or light emitting layers in OLEDs may not be thermally stable at the desired annealing temperatures. For example, some commonly used OLED organic materials are unstable at temperatures as low as 60° C. To protect these layers during an annealing process, more directed annealing methods than hotplate- or oven-based annealing methods may be used. For example, in some embodiments, laser or focused IR techniques may be used to anneal the second parylene-based polymer film 38. The use of a laser or focused IR may allow energy to be delivered to the semi-crystalline parylene-based polymer layers with a relatively high degree of specificity, thereby avoiding delivering unwanted energy to the organic layers. Reflector 36 may be used to provide further protection to the organic device layers.

Accordingly, one method of directing annealing energy to the semi-crystalline parylene-based polymer films with specificity is to include optional reflective layer 36 in barrier 30 in combination with a laser annealing process. The laser may be directed initially onto face 52 of barrier 30. Radiation from the laser passes through second parylene-based polymer layer 38 and then onto reflective layer 36, which reflects the laser beam back through second parylene-based polymer layer 38. Thus, reflective layer 36 helps to prevent the laser beam from penetrating into the organic device layers 44, 46 and 48. This may also prevent the radiation from reaching first parylene-based polymer layer 32; however, the initial crystallinity of first parylene-based polymer layer may be sufficiently high to provide a significantly greater amount of protection than a polyacrylate film or amorphous parylene film, even in the absence of annealing.

Any suitable material may be used as optional reflective layer 36. For example, in frontside-emitting OLEDs, light is emitted through the substrate 40. Therefore, in these structures, reflective layer 36 may be opaque without affecting device performance. Suitable opaque materials for reflective layer 36 include, but are not limited to, aluminum and other metals. On the other hand, in backside-emitting OLEDs, light is emitted through the device face opposite the substrate (indicated at 52 in FIG. 2). Therefore, reflective layer 36 must transmit light emitted by the OLED. In this case, reflective layer 36 may be formed from a so-called Bragg reflector, which is formed from a plurality of alternating layers of a high dielectric constant material and a low dielectric constant material. The reflectivity of the layer may be tuned by giving each layer a thickness of one-quarter of the wavelength of the radiation to be reflected, or may be given a broad band of reflectivity by varying the thicknesses of the individual dielectric layers. Therefore, if the OLED is to emit visible light, reflective layer 36 may be configured to reflect radiation in the ultraviolet range, and a UV-eximer laser (or other suitable UV laser) may be used to anneal second parylene-based polymer layer 38. Suitable dielectric sub-layers to be used as layers in a Bragg reflector arrangement for reflective layer 36 include, but are not limited to, $SiO_2$, $Si_xN_y$, $SiO_xN_y$, $Ta_2O_5$, $TiO$, and other metal oxides.

Figure 3:
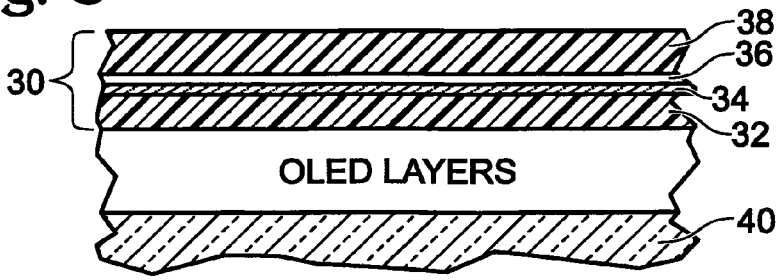
FIG. 3 is a greatly magnified, sectional view of the embodiment of FIG. 2, wherein the organic light emitting device layers are depicted as a single layer.
Figure 4:
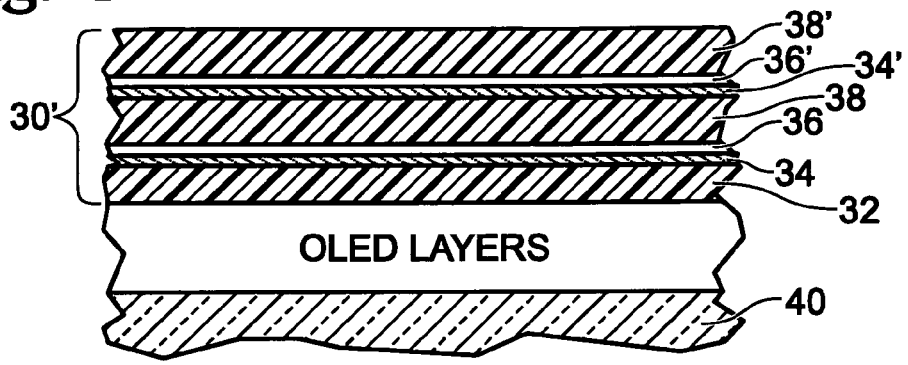
FIG. 4 is a greatly magnified, sectional view of another embodiment of an organic light emitting device having a protective barrier.
Figure 5:
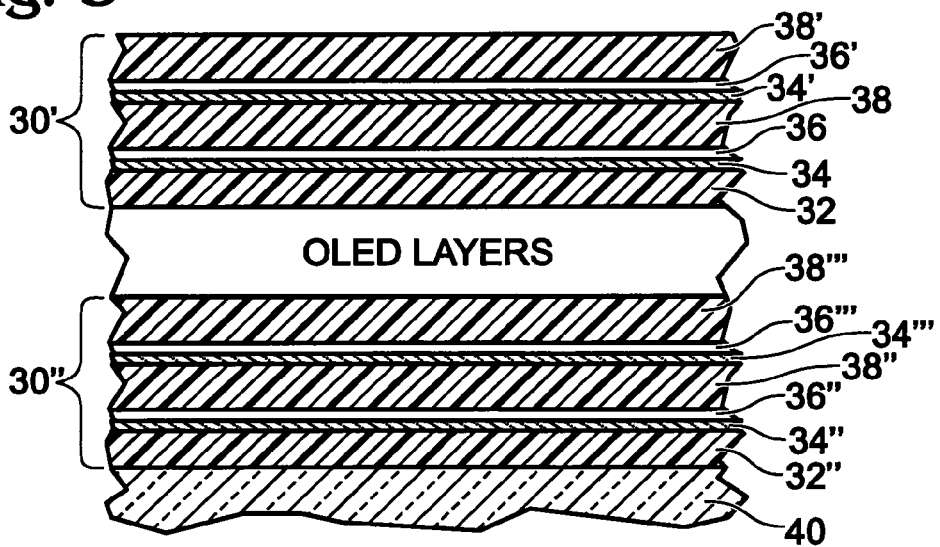
FIG. 5 is a greatly magnified, sectional view of another embodiment of an organic light emitting device having protective barriers formed on each side of the organic light emitting device layers.

The embodiment of FIG. 2 depicts a single barrier 30 formed over the OLED layers (i.e. anode 42, organic layers 44, 46, 48, and cathode 50). If desired, more than one barrier 30 may be formed over and/or under the OLED layers to provide additional protection from oxygen, water vapor and/or other environmental gases. FIGS. 4 and 5 depict alternate embodiments having more than a single barrier 30. In FIGS. 4 and 5, the active OLED layers are depicted as a single region in the device structure. For purposes of comparison, FIG. 3 shows an equivalent structure to that shown in FIG. 2, but also with all active OLED layers shown as a single region.

In the embodiment of FIG. 4, barrier 30' includes an additional inorganic barrier layer 34' formed over second semi-crystalline or highly crystalline parylene-based layer 38 of first barrier 30, an additional (optional) reflective layer 36', and a third parylene-based polymer layer 38'. It will be appreciated that reflective layer 36 in first barrier 30 may provide sufficient protection for the underlying OLED layers that reflective layer 36' may be omitted (or both may be omitted when suitable). The use of the additional inorganic barrier 34' and third semi-crystalline or highly crystalline parylene-based polymer layer 38' in barrier 30' may offer greater resistance to water vapor and oxygen where desired compared to the use of barrier 30.

Next, in the embodiment of FIG. 5, two barriers, 30' and 30", are provided over and beneath the OLED layers, respectively. Barrier 30" is positioned between the OLED layers and substrate 40'. This helps to prevent water vapor and oxygen from contaminating the OLED layers when a flexible plastic substrate 40' is used, for example, to manufacture a flexible OLED. The depicted barrier 30" has a similar structure to barrier 30' (i.e. layers 32", 34", 36", 38", 34''', 36''', and 38''' of barrier 30" correspond to layer 32, 34, 36, 38, 34', 36', and 38' of barrier 30', respectively), but it will be appreciated that barrier 30" may have either more or fewer inorganic barrier layers and/or organic barrier layers. Furthermore, it will be appreciated that any desired numbers of layers of semi-crystalline or highly crystalline parylene-based polymer barrier layers and inorganic barrier layers may be below and/or above the OLED layers to provide as much protection against oxygen and water vapor as desired.

As described above, the embodiments disclosed above are all conducted inside a vacuum deposition system. The barrier stack of this invention may also be used to provide temporary protection to an OLED by forming an encapsulated OLED device pending for further "glass-sealing" or "hermetic sealing" of the encapsulated OLED device under atmospheric conditions, i.e. outside of a vacuum environment. This packaging method removes the time consuming glass-sealing or hermetic sealing step from the costly vacuum deposition system. "Glass-sealing" refers to sealing a glass cover to a glass substrate that already has an OLED device fabricated on the substrate. The glass sealing may also include sealing desiccant inside the glass packages to increase the lifetime of the sealed OLED package.

"Hermetic sealing" refers to sealing methods that essentially permanently prevent all external chemical species, including water vapor and oxygen, from entering the sealed device package per the MIL-STD-883 standard.

Many hermetic sealing methods have been developed in the semiconductor packaging industries over the last three decades. However, these hermetic sealing methods are difficult to apply directly to current OLED manufacturing process. This is at least because these hermetic sealing techniques are performed either at high temperatures under vacuum, or under an atmospheric environment. As described above, due to the chemical instability of the low work function metals used as cathodes in OLEDs, the OLEDs typically must be encapsulated or otherwise protected from the outside atmosphere before being removed from the low-vacuum fabrication environment. Furthermore, the organic materials used in OLEDs may not be able to withstand the high temperatures of the vacuum hermetic sealing methods. Therefore, the glass or metal protective canisters of current commercial OLEDs are bonded over the OLEDs with a UV-curable adhesive. The resulting seal is not hermetic, and a desiccant must be added to the canister interior to trap any moisture able to diffuse through the seal. Even with the desiccant, device lifetimes of only 2 years or so are achieved, because the glues used are typically organic polymers with high WVTR and OTR values. The method disclosed in the above-described U.S. Pat. No. 6,570,325 to Graff et al. is not hermetic, and only achieves about half of the lifetime as the double-glass-sealed OLED package with included desiccant.

To allow an off-vacuum line sealing with a glass/glue, metal/glue, or hermetic enclosure to be fabricated around an OLED, the OLED may first be subjected to a pre-glass- or pre-hermetic-sealing process (or encapsulation step) in which a barrier film is deposited over the active device layers of the OLED, before the OLED is removed from the vacuum fabrication environment. The barrier film may be a single layer of one of the semi-crystalline parylene-based polymer films described herein, and/or may also include inorganic layers disposed over the semi-crystalline parylene-based polymer films. The barrier film may also include a stack of multiple alternating layers of semi-crystalline parylene-based films and inorganic films. Furthermore, the barrier film may include a polymer film made from a polymer other than a semi-crystalline parylene-based polymer, in combination with an appropriate inorganic film.

Depending upon the barrier film used, such a barrier film may protect the OLED from oxygen and water vapor for a period of days (for a single parylene-based polymer film as disclosed herein) to months or even years (for a barrier film having multiple alternating layers of parylene-based polymer films and inorganic films). Furthermore, a deposition chamber for forming the barrier layer or stack may be connected directly to vacuum chambers for the formation of the OLED device layers. Such a configuration would allow the barrier film formed immediately after deposition of the cathode without breaking system vacuum.

Figure 6:
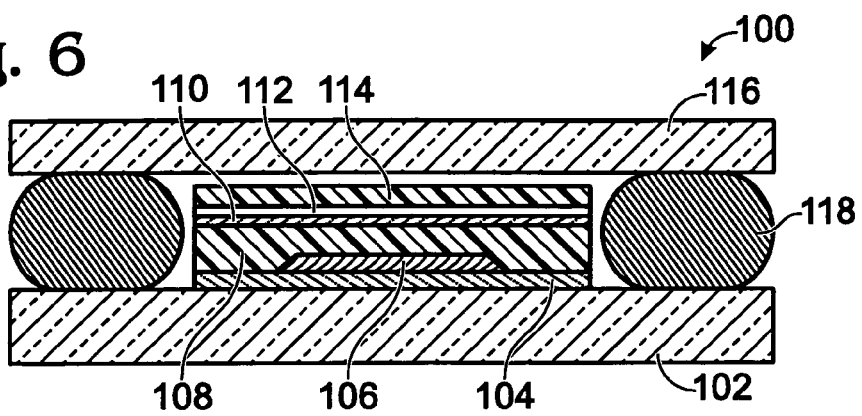
FIG. 6 is a schematic depiction of a hermetic sealing lid sealed over an organic light emitting device.

After fabricating the barrier layer or layers to form an encapsulated OLED device, the encapsulated OLED device may be hermetically sealed under atmospheric conditions without causing damage to the OLED cathode. FIG. 6 depicts an exemplary embodiment of an encapsulated and hermetically (or near-hermetically) sealed OLED, generally at 100. Encapsulated and hermetically sealed OLED 100 includes a substrate 102, an anode 104, an organic region 106, representing the organic electron transport, hole transport, and light emitting layers, all covered by a barrier layer as disclosed above. The barrier layer includes a first semi-crystalline parylene-based polymer layer 108, an inorganic barrier layer 110, a reflective layer 112 and a second semi- or highly crystalline parylene-based polymer layer 114. A hermetic lid 116 is positioned over the OLED, and a hermetic sealing material 118 is used to seal the gap between substrate 102 and lid 116. While the depicted barrier layer includes both semi-crystalline (and/or highly crystalline) parylene-based polymer layers and inorganic barrier layers, it will be appreciated that it may include either more or fewer polymer and/or inorganic barrier layers.

Any suitable hermetic sealing technique and materials may be used. Suitable hermetic sealing techniques include, but are not limited to, techniques performed at temperatures that the organic layers within the OLED can withstand and/or techniques that involve localized heating that does not damage the organic layers. For a frontside-emitting device, light is not emitted through the lid; therefore, either metal or ceramic lids may be used. For a backside-emitting device, the lid must transmit emitted light, so a transparent glass or ceramic lid may be used. Examples of suitable hermetic sealing methods are set forth in Table I.

TABLE I

| Hermetic Sealing Process | Hermetic Lid Type | Hermetic Sealing Materials | Sealing Temperature | Examples of Suitable Heating Methods |
|---|---|---|---|---|
| Soldering | Metal | 1. Tin-lead solder 2. Tin-lead with additions of indium and silver | 1. Fast preheat period (3-5 minutes) 2. Minimum time | Focused IR |

TABLE I-continued

| Hermetic Sealing Process | Hermetic Lid Type | Hermetic Sealing Materials | Sealing Temperature | Examples of Suitable Heating Methods |
|---|---|---|---|---|
| | | 3. Bismuth-tin alloys | (3-5 minutes) above the sealer's melting temperature<br>3. Peak temperature of 40° C. to 80° C. above the melting temperature<br>4. Fast cool-down after solidification | |
| Brazing | Metal | Eutectic gold-tin alloy | 1. 2-4 minutes above the eutectic temperature of 280° C.<br>2. peak temperature of 350° C. | Localized electrical heating |
| Parallel Seam Welding (Series Welding) | Metal | Nickel or gold plating | Localized high temperature | AC current pulse |
| Laser Welding | Metal | Nickel or gold plating | Very localized high temperature | 1. $CO_2$ laser<br>2. Nd-Yag laser |
| Glass Sealing | Metal, ceramic or glass | 1. Lead-zinc-borate glasses<br>2. Lead-zinc-borate glass with addition of low-CTE fillers such as fused silica and betaeucryptite | Below 420° C. | 1. Furnace sealing<br>2. IR heaters<br>3. Focused IR light |

Because many organic light emitting materials are thermally unstable at relatively low temperatures, those hermetic sealing methods that utilized localized or highly localized heating may be particularly suitable. Such methods include, but are not limited to, $CO_2$ and Nd-Yag lasers, focused infrared heaters, pulsed AC currents and a reactive nano-foil such as RNT FOIL sold by RNT of Hunt Valley, Md. This reactive micro-foil includes nano-particles that under heat activation can generate localized heating for pre-blazed substrate surface, thereby resulting in hermetic sealing while avoiding thermal damage. The details of this technology can be found on the Internet at www.RNTfoil.com. Using these heating these localized heating methods, materials such as gold-lead alloys, lead-tin or bismuth-tin solders, and vitreous glasses prepared from lead-zinc borate or its composites consisting of fused silica can be used to seal a hermetic canister or lid over the parylene-based polymer film-coated OLED.

Because the transport polymerization of semi-crystalline parylene-based polymer films results in the formation of a conformal polymer film, the edges of the OLED device may be cleaned to expose the pad or lead area for interconnect to ICs. This may be done using showdown mask or photo-resist and plasma etching techniques. In addition, the edge of the substrate may be cleaned of any parylene-based polymer film present in the regions where hermetic sealing is to be performed before sealing the hermetic lid to the substrate. Cleaning may be performed via laser ablation, using showdown mask or photo-resist and preferably with plasma etching techniques, or via any other suitable method.

Although the present disclosure includes specific embodiments of barriers for OLEDs and methods of forming the barriers, specific embodiments are not to be considered in a limiting sense, because numerous variations are possible. The subject matter of the present disclosure includes all novel and nonobvious combinations and subcombinations of the various films, processing systems, processing methods and other elements, features, functions, and/or properties disclosed herein. The description and examples contained herein are not intended to limit the scope of the invention, but are included for illustration purposes only. It is to be understood that other embodiments of the invention can be developed and fall within the spirit and scope of the invention and claims.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A method of forming a protective barrier for an organic light emitting device, wherein the organic light emitting device is formed on a substrate and includes a plurality of layers of materials, the plurality of layers of materials including an organic light emitting layer, the method comprising:

forming a semi-crystalline parylene-based polymer layer and an inorganic layer over an underlying layer, wherein the semi-crystalline parylene-based polymer layer is formed via transport polymerization of a reactive intermediate species, and wherein the substrate has a temperature below a melting temperature of the reactive intermediate species during transport polymerization.

2. The method of claim 1, wherein the semi-crystalline parylene-based polymer layer is formed from at least one material selected from the group consisting of parylene, partially fluorinated parylene, and fully fluorinated parylene.

3. The method of claim 1, wherein the inorganic layer is formed after the semi-crystalline parylene-based polymer layer.

4. The method of claim 3, wherein the semi-crystalline parylene-based polymer layer is a first semi-crystalline parylene-based polymer layer.

5. The method of claim 1, further comprising forming a reflective layer and a second semi-crystalline parylene-based polymer layer on the inorganic layer.

6. The method of claim 5, wherein the reflective layer is formed from a metal material.

7. The method of claim 5, wherein the reflective layer is formed from at least one alternating layer of a lower refractive index dielectric material and a higher refractive index dielectric material.

8. The method of claim 1, further comprising annealing the semi-crystalline parylene-based polymer layer.

9. The method of claim 8, wherein the semi-crystalline parylene-based polymer layer is annealed at 350 to 400° C. for a duration between approximately 2 and 30 minutes.

10. The method of claim 9, wherein the semi-crystalline parylene-based polymer layer is annealed via a UV Excimer laser or focused IR energy.

11. The method of claim 9, wherein the semi-crystalline parylene-based polymer layer is annealed under an atmosphere essentially free of oxygen.

12. The method of claim 1, wherein the substrate is at a temperature of between −30 and −50 degrees Celsius during transport polymerization.

13. The method of claim 12, wherein the transport polymerization is conducted inside a chamber essentially free of oxygen and water vapor.

14. The method of claim 12, wherein the transport polymerization is conducted inside a chamber under a vacuum of less than 1 millitorr.

15. The method of claim 1, wherein the inorganic layer is formed from at least one material selected from the group consisting of $SiO_2$, aluminum oxide, $SiO_xN_y$, and $Si_xN_y$.

16. The method of claim 1, wherein the semi-crystalline parylene-based polymer layer has a thickness from 1000 and 30,000 angstroms.

17. The method of claim 1, wherein the inorganic layer has a thickness from 500 and 5000 angstroms.

18. A method of forming a protective barrier in an organic light emitting device; the organic light emitting device including a plurality of layers of materials formed on a substrate, the plurality of layers of materials including an organic light-emitting layer, the method comprising:

forming an inorganic layer and a parylene-based polymer layer over an underlying layer; and annealing the parylene-based polymer layer.

19. The method of claim 18, wherein annealing the parylene-based polymer layer includes annealing the parylene-based polymer layer with a UV Excimer laser.

20. The method of claim 19, wherein the parylene-based polymer layer is annealed under an atmosphere essentially free of oxygen.

21. The method of claim 18, further comprising forming a reflective layer between the organic light emitting layer and the parylene-based polymer layer before annealing the parylene-based polymer layer.

22. A method of protecting an organic light emitting device from environmental degradation, the organic light emitting device including a plurality of device layers formed on a substrate, the method comprising:

forming a protective barrier layer over the organic light emitting device under a reduced pressure environment, thereby encapsulating the organic light emitting device between a substrate and a protective barrier layer to form an encapsulated organic light emitting device, wherein the protective barrier layer includes a first semi-crystalline parylene-based polymer layer, an inorganic layer, and a second semi-crystalline parylene-based polymer layer;

transferring the temporary encapsulated organic light emitting device out of the reduced pressure environment; and sealing a protective structure over the protective barrier layer under atmospheric conditions.

23. The method of the claim 22, wherein the substrate is made at least partially of glass.

24. The method of the claim 22, wherein the substrate is made at least partially of a transparent plastic material, further comprising forming a protective barrier layer between the device layers and the substrate.

25. The method of the claim 22, wherein the protective structure is hermetically sealed over the protective barrier.

26. The method of the claim 22, wherein the semi-crystalline parylene-based polymer layers are each formed from a material selected from the group consisting of parylene, partially fluorinated parylene and fully fluorinated parylene.

27. The method of the claim 22, wherein the protective barrier layer includes multiple alternating layers of at least one semi-crystalline parylene-based polymer material and at least one inorganic material.

28. The method of the claim 27, wherein the multiple alternating layers further comprise a reflective layer.

29. The method of claim 28, further comprising annealing at least one of the layers of at least one semi-crystalline parylene-based polymer material to give the semi-crystalline parylene-based polymer material a crystallinity of at least 50%.

30. The method of the claim 22, wherein sealing the protective structure over the protective barrier includes sealing a lid to the substrate with an adhesive, wherein the lid is transparent to visible light.

31. The method of the claim 30, further comprising adding a desiccant between the protective barrier and the protective structure.

32. The method of claim 30, wherein the lid is made at least partially of a glass material.

33. The method of claim 30, wherein the lid is made at least partially of a plastic material.

34. The method of the claim 22, wherein sealing the protective structure over the protective barrier includes sealing at least one of a metal lid and a ceramic lid to the substrate.

35. The method of the claim 22, wherein sealing the protective structure over the protective barrier includes hermetically sealing the protective structure over the protective barrier with a hermetic sealer.

36. The method of claim 35, wherein the hermetic sealer is at least one sealer selected from the group consisting of vitreous glass, metal alloys and reactive nano-foils.

\* \* \* \* \*